United States Patent [19]

Ueda et al.

[11] Patent Number: 5,076,877
[45] Date of Patent: Dec. 31, 1991

[54] APPARATUS FOR DRY ETCHING

[75] Inventors: Tetsuya Ueda, Moriguchi; Kohsaku Yano, Osaka, both of Japan

[73] Assignee: Matsushita Electric Industrial Co., Ltd., Osaka, Japan

[21] Appl. No.: 523,422

[22] Filed: May 15, 1990

[30] Foreign Application Priority Data

May 18, 1989 [JP] Japan ................................. 1-124828

[51] Int. Cl.$^5$ .......................................... H01L 21/00
[52] U.S. Cl. ..................................... 156/345; 118/730
[58] Field of Search ...................... 156/345; 118/730; 204/298.35

[56] References Cited

U.S. PATENT DOCUMENTS

| | | | |
|---|---|---|---|
| 4,307,283 | 12/1981 | Zajac | 204/298.35 |
| 4,528,438 | 7/1985 | Poulsen et al. | 156/345 |
| 4,615,756 | 10/1986 | Tsujii et al. | 156/345 |
| 4,624,214 | 11/1986 | Suzuki et al. | 156/345 |
| 4,788,994 | 12/1988 | Shinbara | 156/345 |
| 4,950,376 | 8/1990 | Hayashi et al. | 156/345 |
| 4,961,812 | 10/1990 | Baerg et al. | 156/345 |

FOREIGN PATENT DOCUMENTS

| | | | |
|---|---|---|---|
| 60-249328 | 12/1985 | Japan | 156/345 |
| 60-184679 | 2/1986 | Japan | |
| 62-243785 | 10/1987 | Japan | 156/345 |
| 63-83286 | 4/1988 | Japan | 156/345 |
| 64-8624 | 1/1989 | Japan | 156/345 |

OTHER PUBLICATIONS

Anisotropic Etching of Polycrystalline Silicon with a Hot Cl$_2$ Molecular Beam, Suzuki et al., J. Appl. Phys. 64(7) 3697-3705.
Hot-Het Etching of Pb, GaAs, and Si, Geis et al., J. Vac. Sci. Technol. B4 (1) Jan./Feb. (1987) 363-365.
Hot Jet Etching of GAAs and Si, Ceis et al., J. Vac. Sci. Technol. B4 (1) Jan./Feb. 1986 315-317.
Plasmaless Dry Etching of Silicon with Fluorine-Containing Compounds, Ibbotson et al., J. Appl. Phys. 56 (1) 2939-2942.

Primary Examiner—David A. Simmons
Assistant Examiner—George A. Goudreau
Attorney, Agent, or Firm—Stevens, Davis, Miller & Mosher

[57] ABSTRACT

An apparatus for dry etching, which comprises a stage for supporting a substrate, a rotor having a center shaft, the stage and an arm connecting the stage to the center shaft, and a driving means for turning the rotor at the center shaft as a turning center in the direction tangential to the circumference of a circle established by turning of the surface of the substrate at the center shaft as a turning center, the rotor being housed in a chamber, can make uniform perpendicular submicron etching with radicals or a reactive gas without using ions and without damages on the substrate.

8 Claims, 10 Drawing Sheets

NUMBER OF VANE
REVOLUTION (rpm)

APPARATUS FOR DRY ETCHING

BACKGROUND OF THE INVENTION

1. Field of the Invention

This invention relates to an apparatus for dry etching, which carries out anisotropic dry etching of a thin film or a substrate with radicals or a reactive gas.

2. Prior Art

With recent high density integration of ultra LSI (large scale integrated circuits) the photolithographic technique for making wirings, contact holes, trenches, etc. by photoresist masking is based on a dry etching process with a good working precision. The dry etching process is a technique of etching a photoresist-patterned thin film by an ion bombardment effect of plasma and chemical reactions and can conduct isotropic or anisotropic etching of Al, poly-Si, Si, SiN, $SiO_2$, silicide, etc. Recently, anisotropic etching is considered to be the best technique for fine working on LSI, because the open parts of the photoresist can be vertically etched exactly thereby. However, with smaller transistor sizes of LSI devices and smaller thicknesses of gate oxide films of MOS transistors, the influence of charged particles (ions), which are utilized during dry etching, upon semiconductor devices has been severe. That is, the charged particles incoming from the substrate surface are charged up on the gate oxide to produce a high electric field on the gate oxide resulting in damage to the gate oxide. This influence has been a recent serious problem on the reliability of MOS transistors.

Figure 11:
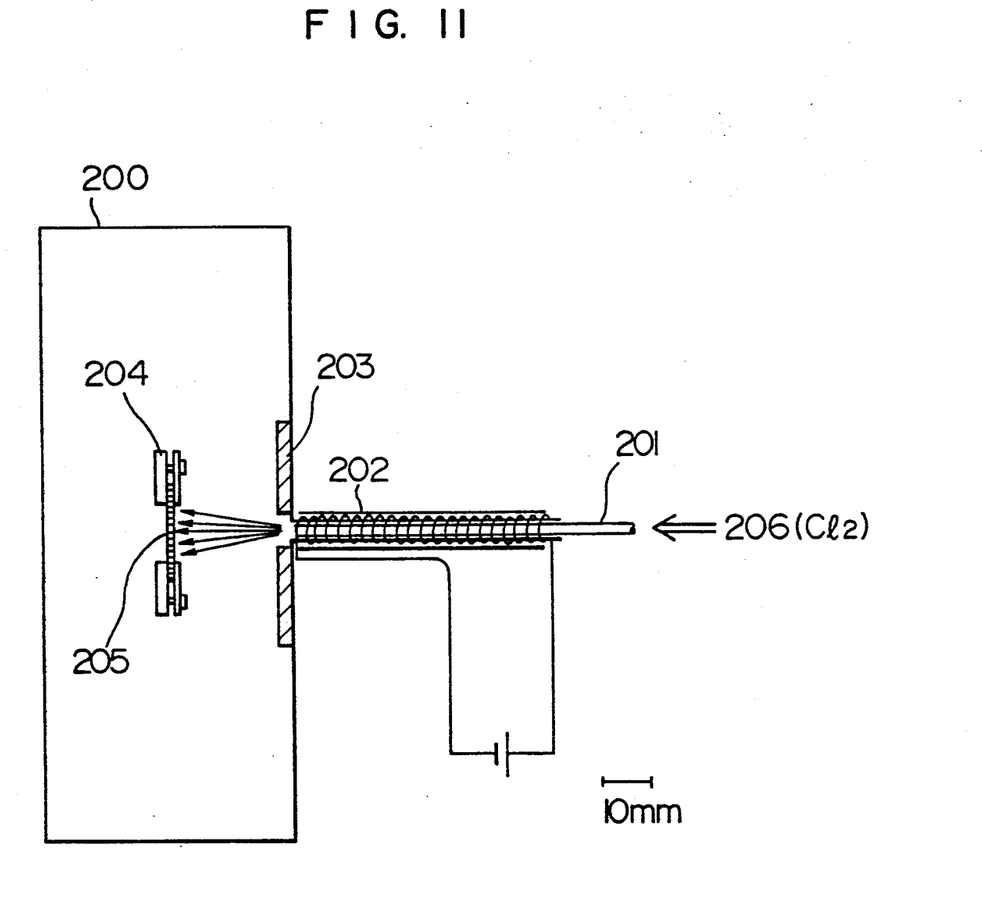
FIG. 11 is a cross-sectional view of the arrangement of the main member of an apparatus for dry etching without using ions according to the prior art.

In order to solve this problem, an anisotropic etching technique without utilizing ions has been recently proposed. In FIG. 11, an apparatus for hot molecular beam etching, which can accomplish anisotropic etching with uncharged radicals, is shown, as disclosed by Suzuki et al in J. Appl. Phys. 64 3697 (1988). The apparatus comprises a vacuum chamber 200, a graphite tube 201 provided on the wall of vacuum chamber 200, and a stage 204. A tungsten (W) heater 202 is wound around the graphite tube 201 to heat a gas flowing through the graphite tube 201. The tip end of graphite tube 201 is connected to the vacuum chamber 200 through a quartz shielding plate 203. A desired substrate 205 on which a material to be etched is deposited is mounted on the stage 204 and then a chlorine ($Cl_2$) gas 206 is introduced into the vacuum chamber 200 through the graphite tube 201 from one end. The chlorine gas 206 is decomposed by heating with the tungsten heater 202 and the dissociated chlorine (Cl) is injected from the other end of graphite tube 201. As a result of adiabatic expansion of gas in vacuum and intermolecular collisions, a molecular beam of uniform momentum is injected to bombard the substrate 205 provided ahead of the graphite tube 201, thereby conducting the etching. Anisotropic etching without using ions can be performed according to this principle. Similar techniques are also disclosed by Geis. M. Wet et al in J. Vac. Sci. and Technol. B4 315 (1987), etc.

Another etching technique without using ions is disclosed in J. Appl. Phys. 56 (10), 15 Nov. 1984, where SiN, Si, etc. can be etched at room temperature with $ClF_3$, $BrF_3$, etc. as an etching gas without using plasma. Damageless etching can be expected from the non-use of ions and a large area etching can be also facilitated. However, the former technique is not utilized for the production of recently required semiconductors of large area, because of a very narrow etching area (about 1 $cm^2$) which is the largest disadvantage and also because of difficult energy control of molecules is another disadvantage since energy is given to the molecules by a differential evacuation system. On the other hand, the latter technique is not suitable for the production of recent ultra LSI devices because of the disadvantage that no anisotropic etching of fine patterns can be made.

SUMMARY OF THE INVENTION

An object of the present invention is to provide an apparatus for dry etching, which can carry out anisotropic etching of fine pattern in sizes of not more than half a micron necessary for ultra LSI and also can carry out uniform etching of a substrate of large area (diameter: about 16 cm) by imparting energy to gas molecules without using charged particles.

According to the present invention, energy is indirectly given to an etchant by moving (turning) a substrate, thereby allowing the etching gas to collide with the moving substrate, without directly giving the energy to the etching gas itself.

More specifically, the present invention provides an apparatus for etching, which comprises a stage for supporting a substrate, the substrate with and the support stage having a mechanism to enable a turning motion in a direction tangential to a circumference established by turning of the surface of the substrate about a predetermined point as a turning center.

In addition to the above-mentioned structure, a reactive gas having an etching action is used or only radicals not ionized in the plasma are taken out and utilized as an etching gas in the present invention.

With the foregoing structure, anisotropic dry etching can be uniformly carried out on a substrate of large area under conditions quite free from ions, that is, with radicals or a reactive gas.

PREFERRED EMBODIMENTS OF THE INVENTION

The present invention will be explained in detail, referring to the various embodiments.

Figure 1:
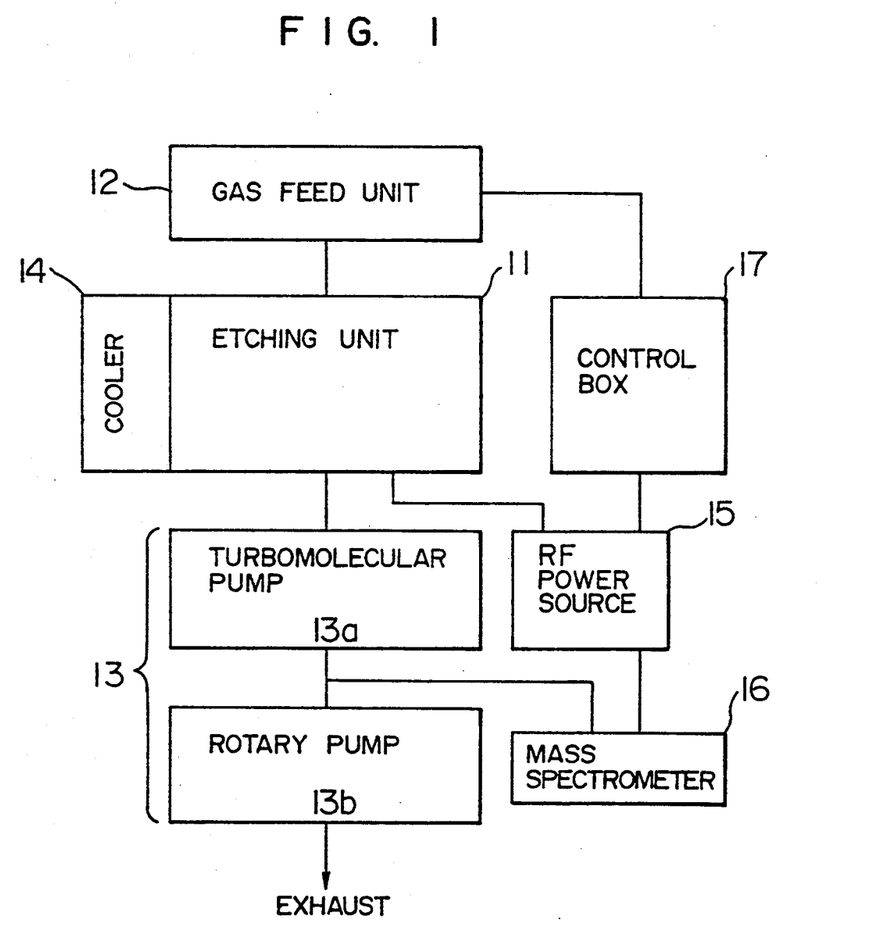
FIG. 1 is a block diagram of an entire apparatus for dry etching according to the present invention.

In FIG. 1, an apparatus for dry etching according to one embodiment of the present invention is shown in a block diagram.

A gas feed unit 12 and an exhaust system 13 are connected to an etching unit proper 11 to constitute the main members of the apparatus for dry etching. The etching unit 11 is also provided with a cooler 14 to cool the outer wall of the etching unit. Furthermore, a high frequency power source 15 is connected to the etching unit proper 11 to supply power to the etching unit 15 proper. The exhaust system 13 comprises a turbomolecular pump 13a and a rotary pump 13b connected in series to evacuate the etching unit proper 11 down to $10^{-7}$ Torr. Between the turbomolecular pump 13a and the rotary pump 13b, a mass spectrometer 16 is provided to sample an exhaust gas for monitoring. The role of the mass spectrometer 16 is to monitor the composition of material to be etched, thereby detecting the end point of etching and improving the etching control. The gas feed unit 12, the high frequency power source 15 and the mass spectrometer 16 can be electrically controlled by a control box 17.

The etching unit proper 11 will be explained in detail below.

Figure 2:
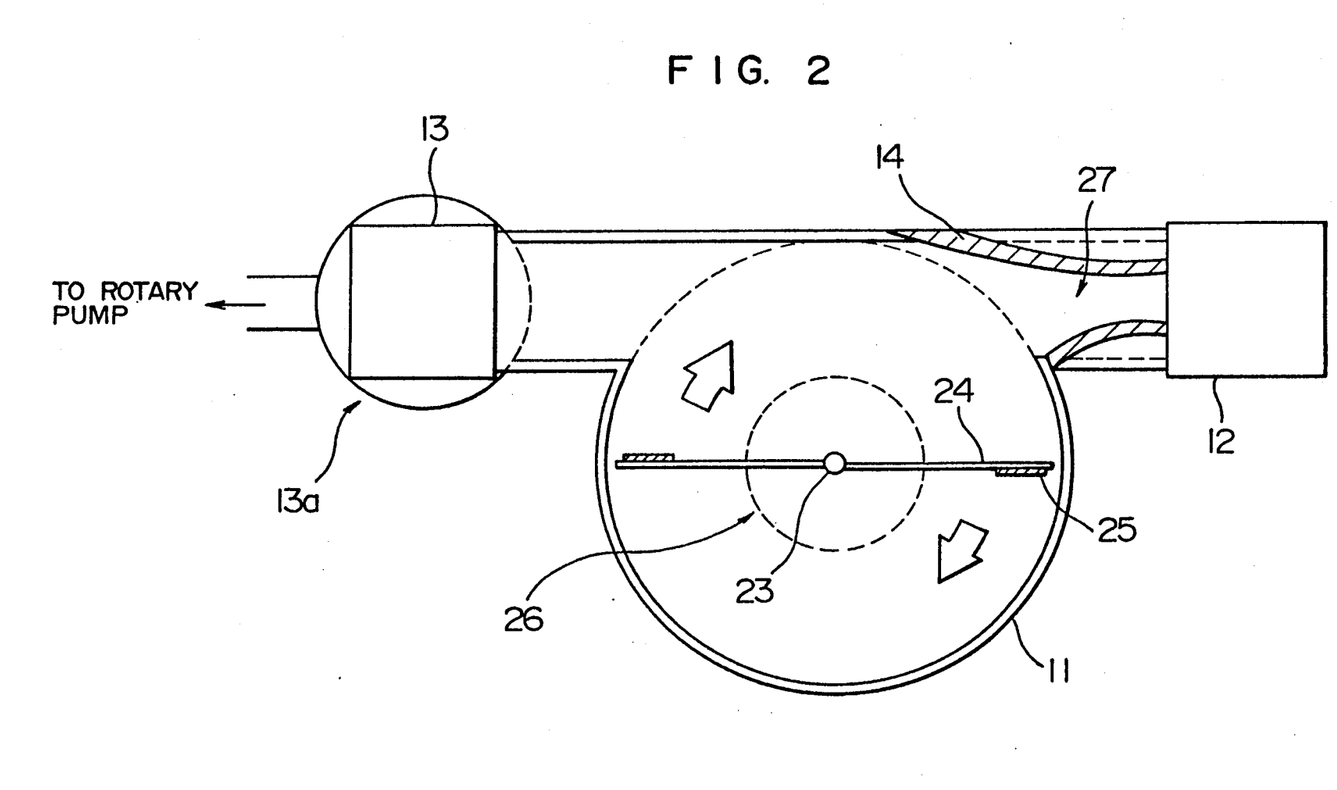
FIG. 2 is a partially cross-sectional plan view showing the arrangement of the main members of the present apparatus for dry etching.
Figure 3:
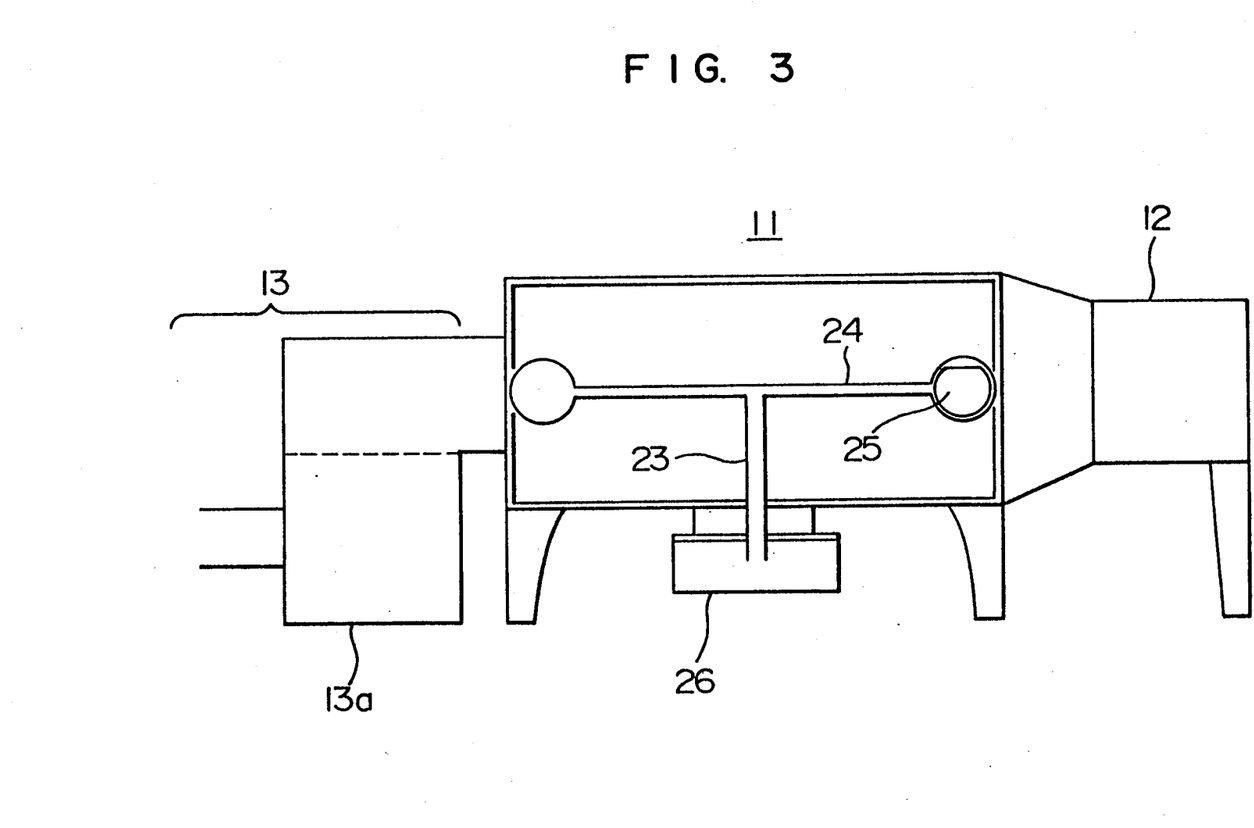
FIG. 3 is a partially cross-sectional elevation view showing the arrangement of the main members of the present apparatus for dry etching as in FIG. 2.

In FIG. 2, the arrangement of the main members of the present apparatus for dry etching is shown in a partially cross-sectional plan view, and in FIG. 3 its partially cross-sectional elevation is shown.

The etching unit proper 11 is a cylindrical stainless steel chamber with a radius of 1.2 m and the gas feed unit 12 and the exhausting system 13 are provided and connected to the side wall of the etching unit proper 11.

In the etching unit proper 11, two vanes 24 are radially provided at a shaft 23 at the center of the unit proper 11 so as to turn around the shaft 23 at the center in the arrow direction shown in FIG. 2. Wafers 25 (6 inches in diameter) can be fixed each at the end parts of the vanes 24. The shaft 23 can be rotated up to 90,000 rpm by a three-phase induction motor 26 provided below the etching unit 11. The three-phase induction motor 26 is rotated by synchronism of high frequency pulses from an external high frequency power source. The outside of the gas stream outlet 27 is surrounded with the cooler 14 to cool by liquid nitrogen. The cooling is done to prevent the etching unit 11 from heating due to hot gas molecules emitted from the vanes 24 under high speed turning and also to prevent hot gas molecules adsorbed on the wall surface of the etching unit proper 11 from rebounding into the unit 11. That is, rebounding of hot gas molecules can be prevented thereby, and the angle of gas molecules going to the substrate surface can be kept almost constant. Thus, anisotropic etching can be carried out stably.

Figure 4:
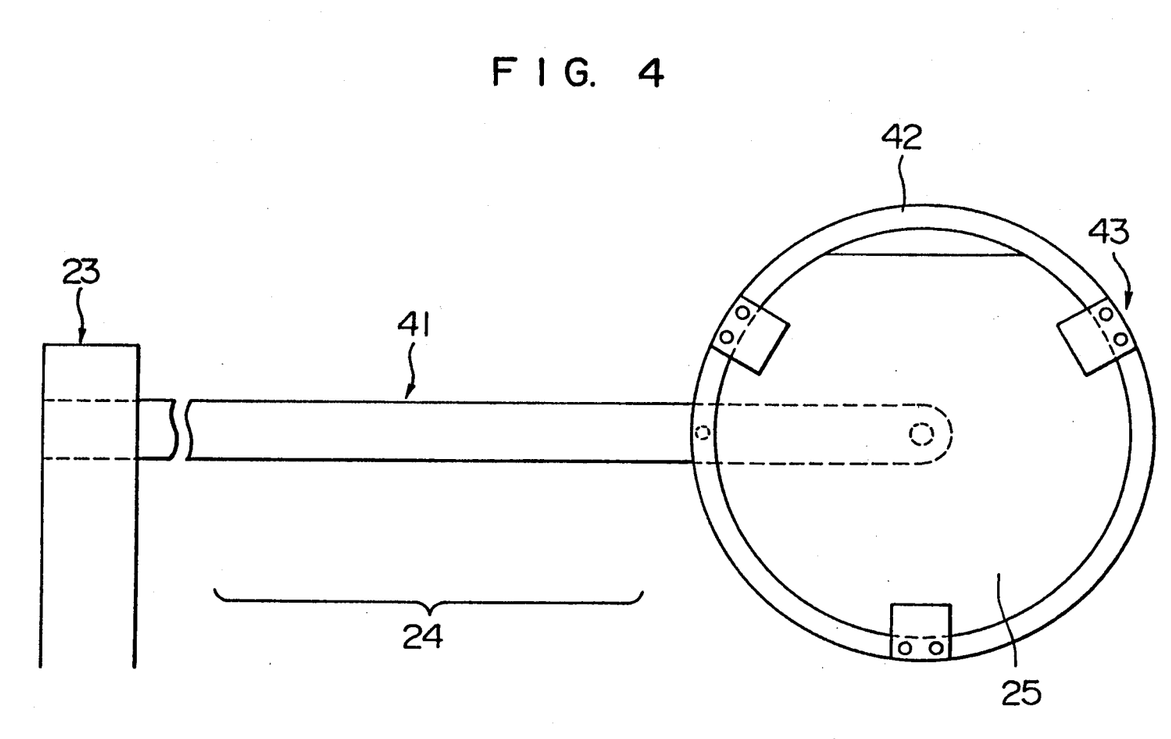
FIG. 4 is a detailed view of a vane according to the present invention.

In FIG. 4, details of vane 24 are shown. The vane 24 comprises a turning member 41 and a substrate stage 42 fixed to the end part of the turning member 41. The substrate stage 42 is 17 cm in diameter so as to mount a 6-inch wafer thereon. Jigs 43 are provided at the periphery of the substrate stage 42 to fix a wafer 25.

Figure 5:
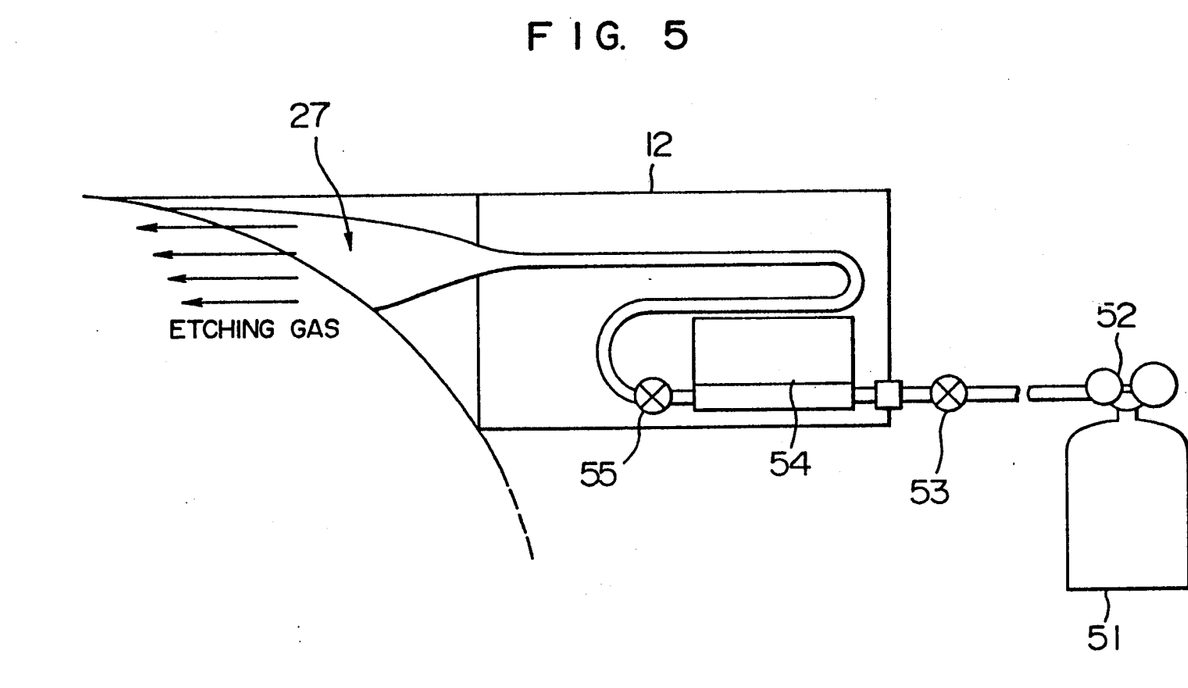
FIG. 5 is a detailed view of a gas feed unit according to the present invention.

In FIG. 5, details of the gas feed unit 12 are shown. An etching gas is supplied to the gas feed unit 12 from a gas cylinder 51 provided at the outside of the unit 12 through a regulator 52 and a valve 53. In the gas feed unit 12 a mass flow controller 54 is provided to supply the etching gas to the etching unit 11 while controlling the flow rate. The etching gas is led to the gas stream outlet 27 through a valve 55. The gas stream outlet 27 is tapered and the diameter of the tapered end is substantially equal to the diameter of the wafer. With this structure, the etching gas can be supplied to the etching unit 11 under good control to enable uniform etching throughout the wafer.

An actual example of etching in the present apparatus for dry etching is given below.

Figure 6A:
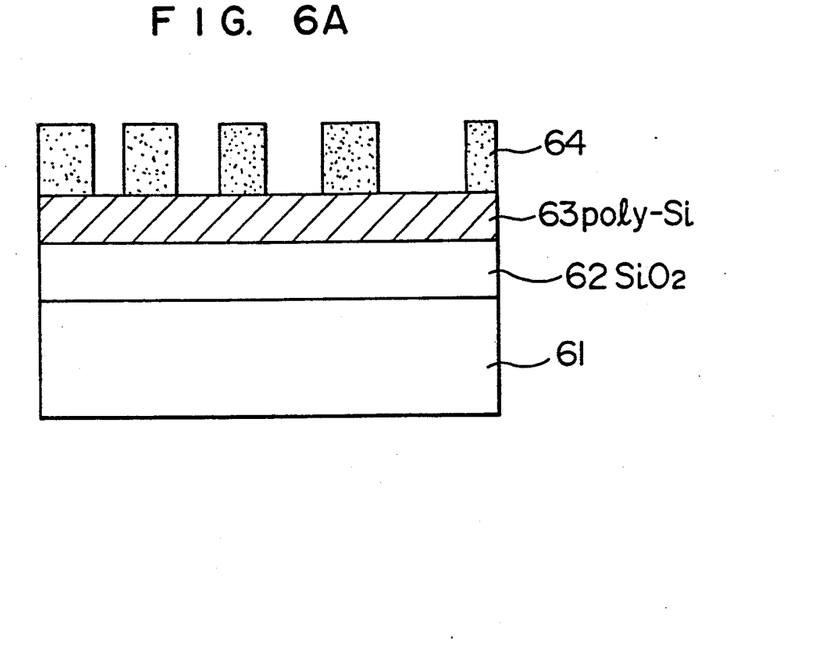
FIGS. 6A and 6B are cross-sectional views of etching state of a sample before and after the etching, respectively.
Figure 6B:
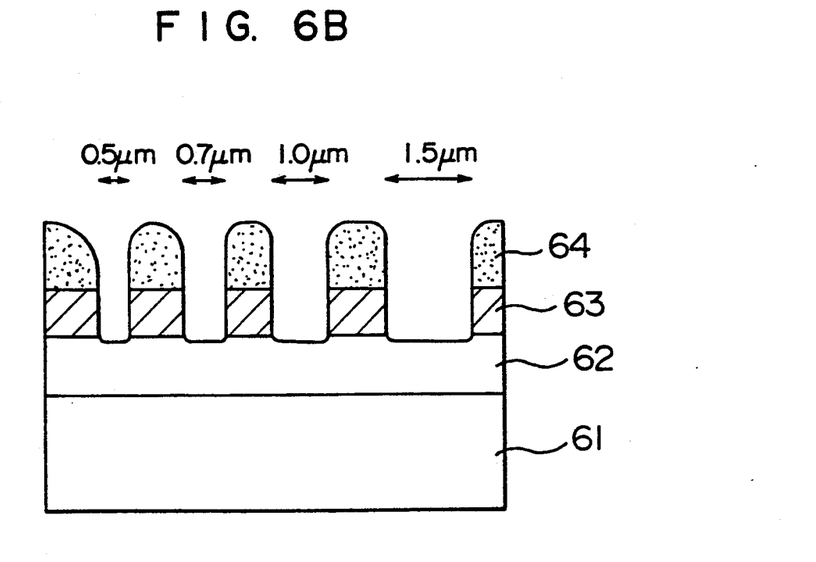

In FIGS. 6A and 6B, cross-sections of a sample before etching and after etching are shown, respectively. Numeral 61 is a Si substrate, 62 is a $SiO_2$ film formed by CVD process, and 63 is poly-Si (thickness: 0.8 μm) as a material to be etched. A photoresist 64 is patterned on 63.

The sample is mounted on the substrate stage 42 in the etching unit 11, and then the unit 11 is evacuated and kept under $10^{-6}$ Torr. Then, the speed of the three-phase induction motor 26 is increased to 90,000 rpm ultimately, while thoroughly cooling the surrounding of the gas stream outlet 27 by the cooler 14. Then, $ClF_3$ is fed as an etching gas from the gas feed unit 12 while keeping the gas flow rate at 100 sccm and the pressure of vacuum at 5 m Torr. The etching gas is continuously fed in that state for 3 minutes 30 seconds. After the etching treatment of the sample, poly-Si 63 is perpendicularly etched along the photoresist 64, as shown in FIG. 6B. The etching is perpendicularly etched up to 0.5 μm, the minimum dimension of etching space of the sample. In the foregoing, $ClF_3$ is used as a reactive fluorine compound gas. ClF, $ClF_5$, BrF, $BrF_3$, $BrF_5$, KrF and XeF can be used in place of $ClF_3$.

The effectiveness of the present apparatus is shown below by simple calculations for the analysis of the mechanism of uniform anisotropic etching of large area according to the present invention without using ions, referring to the following four items: 1) energy of etching gas molecules, 2) linear movement of etching gas molecules, 3) mean free path of etching gas molecules and 4) etching uniformity on the wafer surface.

(1) Energy of etching as molecules

By calculating the energy of etching as molecules, energy is compared between the present apparatus for dry etching and the conventional apparatus for plasma dry etching, based on a coupled discharge system and used as an apparatus for producing semiconductors.

When the speed of three-phase induction motor 26 is 90,000 rpm, the velocity v of vane 24 can be given by the following equation (1):

$$v = r \times 2\pi f \tag{1}$$

where r is the distance from the shaft 23 to the center of wafer 25, which is now 1.0 m, and f is the rotational speed, which is now 1,500/s, and thus $$v = 9.4 \ km/s$$

That is, the relative velocity of the etching gas to the substrate in the etching unit is 9.4 km/s.

When the etching gas molecule is $ClF_3$, the energy of the molecule to the substrate can be calculated by the following equation (2):

$$E = \tfrac{1}{2} \times mv^2 \tag{2}$$

where m is the mass of ClF$_3$, which is $1.53 \times 10^{-25}$ kg.

Thus, $$E = 1/2 \times 1.53 \times 10^{-25} \times (9425)^2$$
$$= 6.7 \times 10^{-18} J = 42.5 \text{ eV}.$$

This energy level is as effective as that of etching at an acceleration at 42.5 eV in the sheath in case of the conventional apparatus for plasma dry etching, based on the coupled discharge system. Generally, acceleration in the sheath of commercially available apparatus for plasma dry etching is in a range of about 10 eV to 100 eV. The energy level of the etching gas of the present apparatus falls within that range, and thus a satisfactory etching efficiency can be obtained.

As to the controllability of the etching rate, a relationship between the number of revolutions of vanes and the relative energy of the gas molecules is derived from the following equations (1) and (2) to give the following equation (3):

$$E = 2m \, r^2 \pi^2 f^2 \qquad (3)$$

Figure 7:
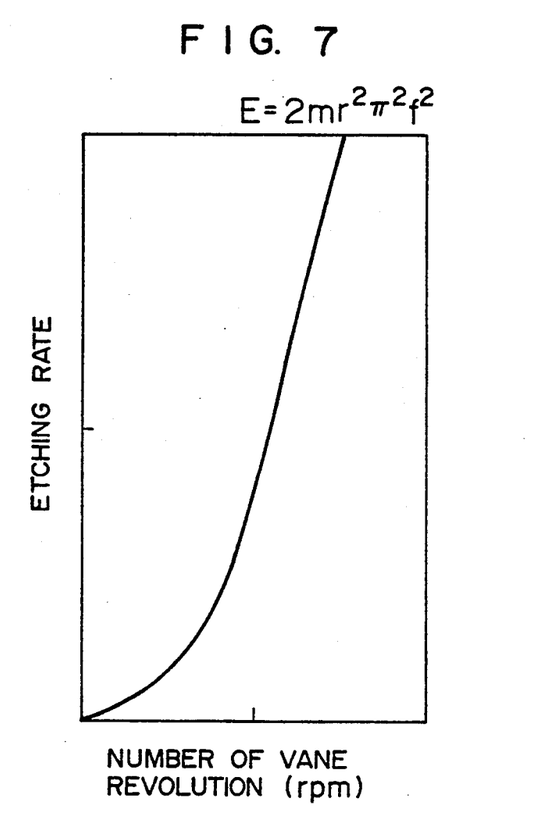
FIG. 7 is a characteristic diagram showing a dependency of etching rate upon the number of vane revolution.

It can be seen that energy E is proportional to the square of the rotational speed f. Furthermore, on the assumption that the etching rate is proportional to the energy of the gas molecules, a relationship as shown in FIG. 7 is obtained. That is, a desired etching rate can be obtained by selecting the speed f of the vanes.

(2) Straight movement of etching gas molecules

The state (shape) of anisotropic etching can be determined from the linear movement of etching gas molecules. Thermal motion is regarded as a factor for changing the angle of the linear movement of gas molecules to the substrate surface. A relationship between the molecule velocity by thermal motion and vane revolution velocity is calculated below on the basis that the etching gas is ClF$_3$.

The velocity of gas molecules by thermal motion can be given by the following equation as a maximum probability velocity according to the assumption of the Boltzmann distribution:

$$V_m = \sqrt{(2kT/m)}$$

where
Vm: maximum probability velocity
k: Boltzmann constant
T: absolute temperature (300° K.)
m: weight of gas molecule ($1.53 \times 10^{-25}$ kg)
Thus, the equation can be calculated as follows:

$$V_m = 232 \text{ m/s}$$

Figure 8:
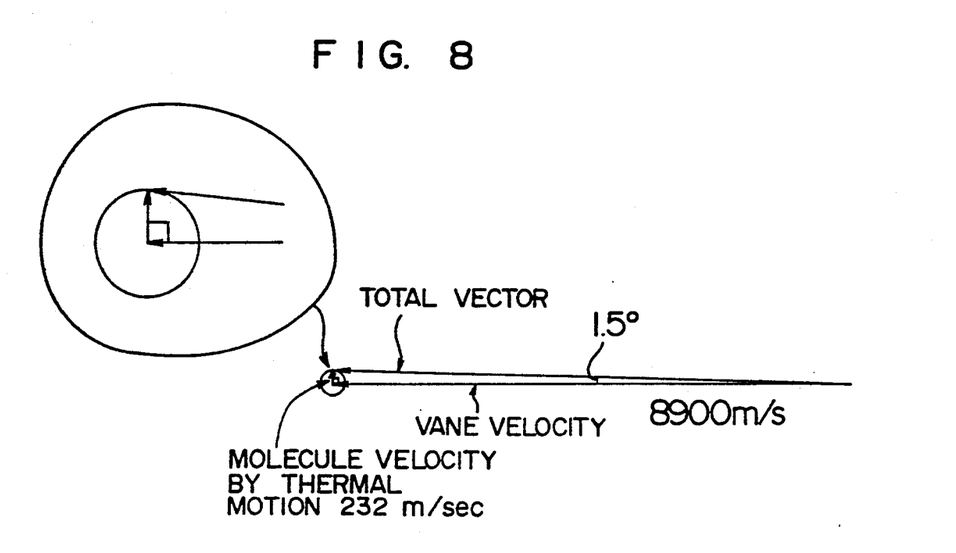
FIG. 8 shows a relationship between the vane speed and the molecule speed by thermal motion.

It can be seen from the calculation that the velocity of gas molecules by heat is about 38 times as high as the vane velocity, and this is shown in FIG. 8 as vectors. Maximum disturbance of the linear movement of gas molecules by thermal motion can be determined by an angle of fluctuation of total vector from the right angle of the molecule velocity vector by thermal motion to the vane velocity vector, as shown in FIG. 8. That is, from the following relationship:

tan $\theta$ = (molecule velocity/vane velocity)

$\theta$ can be given as follows:

$$\theta = 1.5°$$

It can be seen therefrom that the linear movement of gas molecules is not substantially lost by thermal motion.

Furthermore, another factor for disturbing the linear movement of etching gas molecules was investigated, and the following fact was found. In the etching unit 11 there is such a location that the direction of diffusion (vector) of gas molecules from the gas feed unit 12 to the exhausting system 13 is not in parallel with the tangential direction (vector) of turning vanes 24. At that location the linear movement of etching gas molecules perpendicularly incident onto the wafers 25 is lost with a risk that the anisotropy of wafers 25 to the etching is lost. However, the magnitude of the former vector is due to the diffusion caused by the exhausting system 13 and thus is substantially equal to the speed of thermal motion as mentioned before. On the other hand, the velocity of vanes 24 is much higher than the velocity of gas molecules by thermal motion, as calculated before, and the disaccord between the direction of diffusion of etching gas molecules and the tangential direction of turning vanes 24 is not a problem. As a result, anisotropic etching can be maintained.

(3) Mean free path of etching gas molecules

By calculating the mean free path of etching gas molecules, scattering of etching gas molecules in an etching groove can be examined below.

Generally in the apparatus for plasma dry etching, based on a coupled discharge system, the lower the pressure of vacuum, the poorer the anisotropy, whereas the higher the pressure of vacuum, the better the anisotropy. This is due to a relationship between the mean free path of etching gas molecules and the depth of etching groove (aspect ratio).

Mean free path $\lambda$ under the pressure of 10 m Torr in the present apparatus is calculated by the following equation:

$$\lambda = \frac{k \cdot T}{4\sqrt{2}P\sigma} = \frac{1.38 \times 10^{-23} \times 300}{4\sqrt{2} \times 1.33 \times (5.4 \times 10^{-10})^2}$$

wherein
k: Boltzmann constant
T: absolute temperature (300° K.)
P: pressure (10 m Torr = 1.33 Pa)
$\sigma$: collision area of gas molecules
Thus, $\lambda$ can be calculated to be about 2 cm.

The calculated value of the mean free path, about 2 cm, is much larger than the groove size of a material to be etched (0.8 $\mu$m) and thus it is impossible that the etching molecules are scattered by collision with other molecules in the groove. That is, the etching gas molecules, which come in straight, collide with the substrate perpendicularly thereto to anisotropically etch the bottom of the groove to be etched.

(4) Etching uniformity on the wafer surface

The etching uniformity on the wafer surface can be calculated as follows.

In view of the fact that the moleculor energy is proportional to the square of revolving radius r in the equation (3) ($E=2mr^2\pi^2f^2$), the etching uniformity on the wafer surface (wafer diameter: 6 inches) can be calculated from r as follows:

Distance r from the center of shaft 23 to the center of 6" wafer = 1.00 m

Distance r from the center of shaft 23 to the right edge (1.5 cm from the periphery) of 6" wafer = 1.06 m Distance r from the center of shaft 23 to the left edge (1.5 cm from the periphery) of 6" wafer = 0.94 m $$\text{Uniformity} = \frac{(MAX)^2 - (MIN)^2}{2 \times (Average)^2} = \frac{(1.06)^2 - (0.94)^2}{2 \times (1.00)^2} = \pm 12\%$$

Thus, in case of a 6" wafer, the etching can be made with a controllability of ±12%. In the present apparatus the vane length is 1 m, but the etching uniformity on the wafer surface can be improved with increasing vane length.

As shown in the foregoing embodiment, the exhaust system 13 comprises a turbomolecular pump 13a and a rotary pump 13b, connected to each other in series, and a mass spectrometer 16 is provided between the turbomolecular pump 13a and the rotary pump 13b. In case of etching of, for example, poly-Si on the oxide film in this structure, the mass spectrometer is set to detect oxygen atoms. The time when the oxygen atoms in the oxide film are detected by mass spectroscopy in succession to the etching of poly-Si must be an end point of etching. The detection of the end point can control the overetching to improve the controllability of etching.

Figure 9:
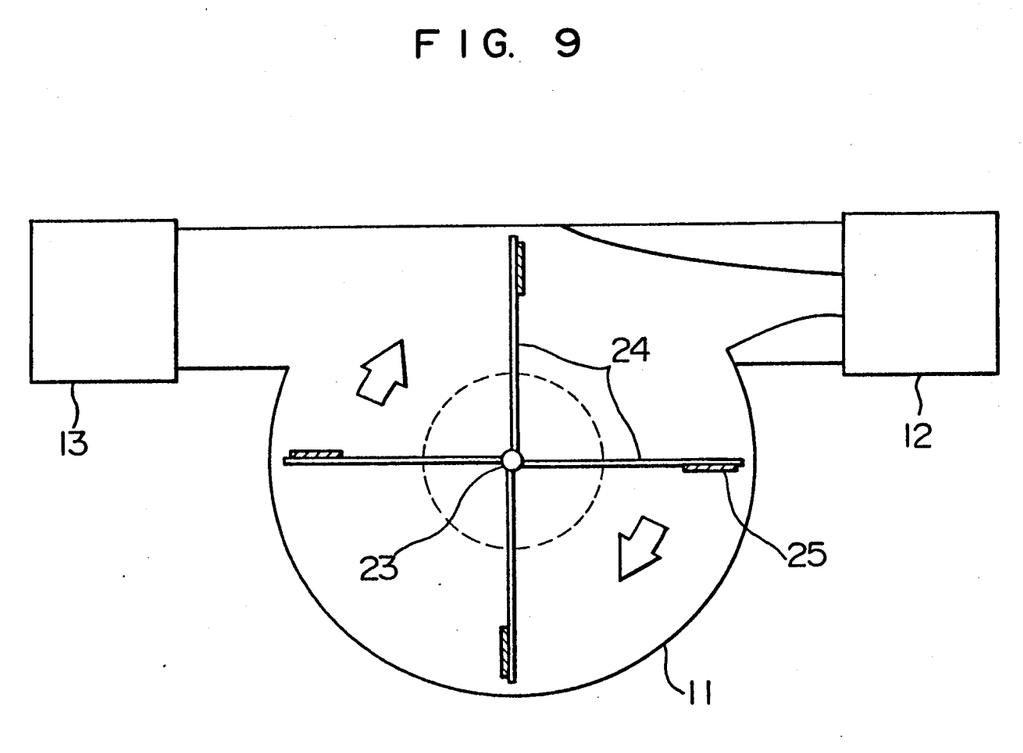
FIG. 9 is a partially cross-sectional plan view of the arrangement of the main members of an apparatus for dry etching with an increased vane number according to the present invention.

In an actual simultaneous etching treatment of many wafers, it is necessary to increase the number of wafers to be etched in one etching treatment. To this end, for example, four vanes are used in a crossing arrangement, as shown in FIG. 9. The number N of the vanes can be increased, so long as the driving power of the three-phase induction motor 26 is sufficient (where N is a natural number). It is also possible to provide a plurality of wafers on one vane.

Figure 10:
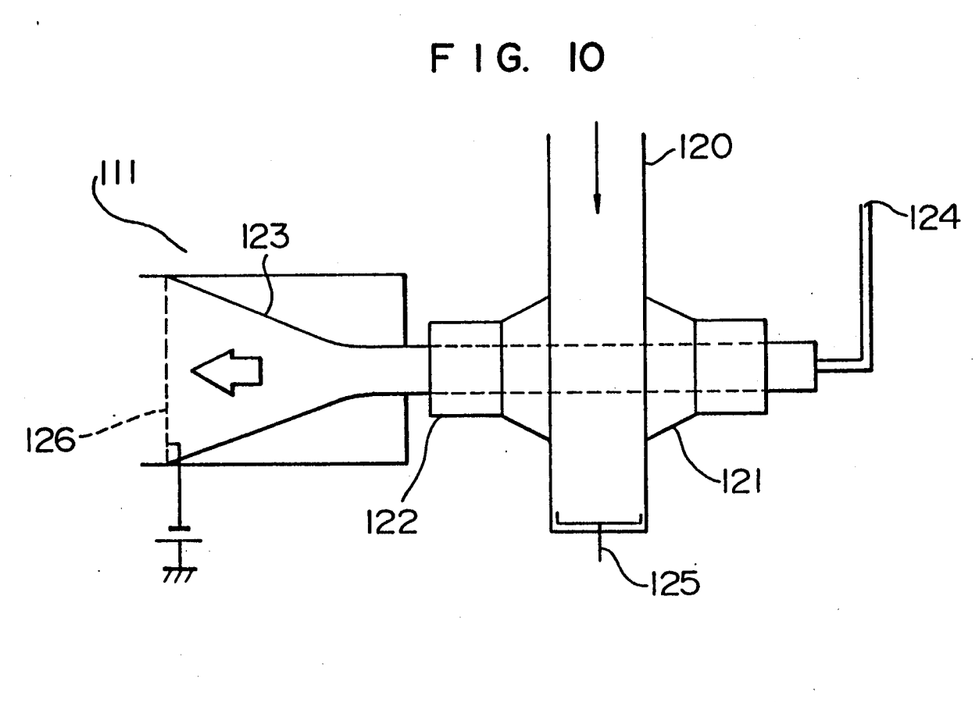
FIG. 10 is a schematic view of plasma source.

Another embodiment of feeding a gas is shown below, where non-ionized radicals in a plasma are to be fed. FIG. 10 is a detailed view of plasma generation source 111, which generates a plasma by irradiating a gas with a microwave. A microwave rectangular waveguide 120 is connected to a cylindrical waveguide through a mode converter 121, and a quartz tube 123 is inserted in the cylindrical waveguide 122. The quartz tube 123 has a gas inlet 124 at one end and is expanded in a tapered shape at the other end and connected to the etching unit 11. Microwave matching is carried out by a matcher 125. An ion trap mesh 126 is provided at the end of quartz tube 123 on the side of the etching unit 11, and all of the ions generated in the plasma generation source 111 are trapped by the ion trap mesh 126. That is, only radicals can be introduced into the etching unit 11 thereby, and anisotropic etching can be carried out without using ions. By the plasma generation source, F radicals such as CF$_4$, CHF$_3$, etc. can be readily produced.

As is obvious from the foregoing, the following results can be obtained according to the present invention:

(1) Perpendicular submicron etching can be made with radicals or a reactive gas without using ions.

(2) Damage to on substrate devices by charge-up caused by ions can be prevented in the present dry etching system.

(3) Uniform etching of substrates with larger area can be made.

What is claimed is:

1. An apparatus for dry etching, comprising:
   a holder for supporting a substrate;
   a chamber in which said holder is housed, said chamber including one of radicals and a reactive gas; and
   a driving means for causing the substrate supported on the holder to move in a circular path around a given center such that a vector normal to the main surface of the substrate moves in a direction tangential to the circumference of said circular path established by movement of the substrate around said given center and such that kinetic energy is imparted to said radicals or said reactive gas in the chamber by the movement of the substrate, thereby anisotropically etching the substrate.

2. An apparatus for dry etching, comprising:
   a rotor including a holder for supporting a substrate, said holder including an arm for securing said substrate, said rotor being turnable around a center shaft;
   a chamber for housing said rotor, said chamber including one of radicals and a reactive gas; and a driving means for causing the substrate supported on the holder to move in a circular path around said center shaft, such that a normal to the main surface of the substrate moves in a direction tangential to the circumference of said circular path established by movement of the substrate around said center shaft and such that kinetic energy is imparted to said radials or said reactive gas in the chamber by the movement of the substrate, thereby anisotropically etching the substrate.

3. An apparatus according to claim 2, wherein the chamber is provided with an exhaust means for evacuating the chamber and a gas-injecting means.

4. An apparatus according to claim 3, wherein the gas-injecting means has a means for introducing a reactive gas to a substrate to be etched.

5. An apparatus according to claim 3, wherein the gas-injecting means has a means for selecting only radicals from a plasma and feeding the radicals into the chamber.

6. An apparatus according to claim 3, wherein the reactive gas is a fluorine compound gas.

7. An apparatus according to claim 3, wherein a plurality of said holders for supporting a plurality of said substrates are provided.

8. An apparatus according to claim 3, wherein the chamber has a cooling means for cooling the chamber.

* * * * *